(12) United States Patent
Frougier et al.

(10) Patent No.: US 12,107,014 B2
(45) Date of Patent: Oct. 1, 2024

(54) NANOSHEET TRANSISTORS WITH SELF-ALIGNED GATE CUT

(71) Applicant: INTERNATIONAL BUSINESS MACHINES CORPORATION, Armonk, NY (US)

(72) Inventors: Julien Frougier, Albany, NY (US); Huimei Zhou, Albany, NY (US); Ruilong Xie, Niskayuna, NY (US); Chanro Park, Clifton Park, NY (US); Kangguo Cheng, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 406 days.

(21) Appl. No.: 17/490,266

(22) Filed: Sep. 30, 2021

(65) Prior Publication Data
US 2023/0099643 A1 Mar. 30, 2023

(51) Int. Cl.
*H01L 29/775* (2006.01)
*H01L 21/8238* (2006.01)
*H01L 27/092* (2006.01)
*H01L 29/66* (2006.01)

(52) U.S. Cl.
CPC .......... *H01L 21/823807* (2013.01); *H01L 21/823821* (2013.01); *H01L 21/823842* (2013.01); *H01L 21/82385* (2013.01); *H01L 27/0924* (2013.01); *H01L 29/66545* (2013.01)

(58) Field of Classification Search
None
See application file for complete search history.

(56) References Cited

U.S. PATENT DOCUMENTS

| | | |
|---|---|---|
| 9,960,077 B1 | 5/2018 | Zang et al. |
| 10,164,104 B2 | 12/2018 | Zhang et al. |
| 10,170,576 B2 | 1/2019 | Ando et al. |
| 10,176,995 B1 | 1/2019 | Wu et al. |
| 10,177,037 B2 | 1/2019 | Zang et al. |
| 10,396,206 B2 | 8/2019 | Jha et al. |

(Continued)

FOREIGN PATENT DOCUMENTS

| | | |
|---|---|---|
| CN | 104616980 A | 5/2015 |
| CN | 112420700 A | 2/2021 |

(Continued)

OTHER PUBLICATIONS

International Search Report issued in corresponding PCT Application No. PCT/CN2022/122078 dated Dec. 29, 2022, 5 pgs.

*Primary Examiner* — Joseph C. Nicely
*Assistant Examiner* — Lamont B Koo
(74) *Attorney, Agent, or Firm* — Tutunjian & Bitetto, P.C.; Samuel Waldbaum (57) ABSTRACT

Semiconductor devices and methods of forming the same include a first device region, a second device region, and an inter-device dielectric spacer between the first device region and the second device region. The first device region includes a first device channel, a first-polarity work function metal layer on the first device channel, and a second-polarity work function metal layer on the first device channel. The second device region include a second device channel, and a second-polarity work function metal layer on the second device channel.

11 Claims, 7 Drawing Sheets

(56) References Cited

U.S. PATENT DOCUMENTS

| | | | |
|---|---|---|---|
| 10,510,620 B1 | 12/2019 | Chanemougame et al. | |
| 2016/0233298 A1 | 8/2016 | Webb et al. | |
| 2018/0108770 A1 | 4/2018 | Cheng et al. | |
| 2018/0342427 A1 | 11/2018 | Xie et al. | |
| 2021/0391220 A1* | 12/2021 | Savant | H01L 21/823857 |

FOREIGN PATENT DOCUMENTS

| | | |
|---|---|---|
| CN | 112510042 A | 3/2021 |
| CN | 113270371 A | 8/2021 |
| CN | 113437065 A | 9/2021 |

* cited by examiner

NANOSHEET TRANSISTORS WITH SELF-ALIGNED GATE CUT

BACKGROUND

The present invention generally relates to semiconductor device manufacturing, and, more particularly, to complementary nanosheet transistors.

As device dimensions scale down, forming gate cut regions can be challenging, due to edge placement error and imprecision in overlay control and gate cut dimension control. Furthermore, when forming n-type transistors and p-type transistors on a single chip, each type of device may benefit from the use of different respective work function metals. However, if a first-type work function metal is deposited on both device types, it may need to be removed from the second-type device. This removal process may cause an over-etch of the first-type work function metal on the first-type device, thereby damaging the first-type device.

SUMMARY

A semiconductor device includes a first device region, a second device region, and an inter-device dielectric spacer between the first device region and the second device region. The first device region includes a first device channel, a first-polarity work function metal layer on the first device channel, and a second-polarity work function metal layer on the first device channel. The second device region include a second device channel, and a second-polarity work function metal layer on the second device channel.

A semiconductor device includes device regions, including a first device region and a second device region and an inter-device dielectric spacer between the first device region and the second device region. Each device region includes a device channel, a gate stack, source/drain structures, and a bottom spacer, between an underlying substrate and the first source/drain structures.

A method of forming a semiconductor device includes forming an inter-device spacer between a stack of layers in a first device region and a stack of layers in second device region. A first work function metal is formed in the first device region and the second device region. The first device region is masked with a first mask. The first work function metal is etched in the second device region. The inter-device spacer and the first mask prevent the first work function metal from being damaged in the first device region. The first mask is removed. A second work function metal is formed in the first device region and the second device region.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Transistors may be formed with spacer material separating adjacent devices. By forming this spacer before the formation of work function metals, overetch between the devices can be prevented. Additionally, the gate cut region may be formed in a self-aligned fashion, removing the imprecision that may result from errors in patterning.

Figure 1:
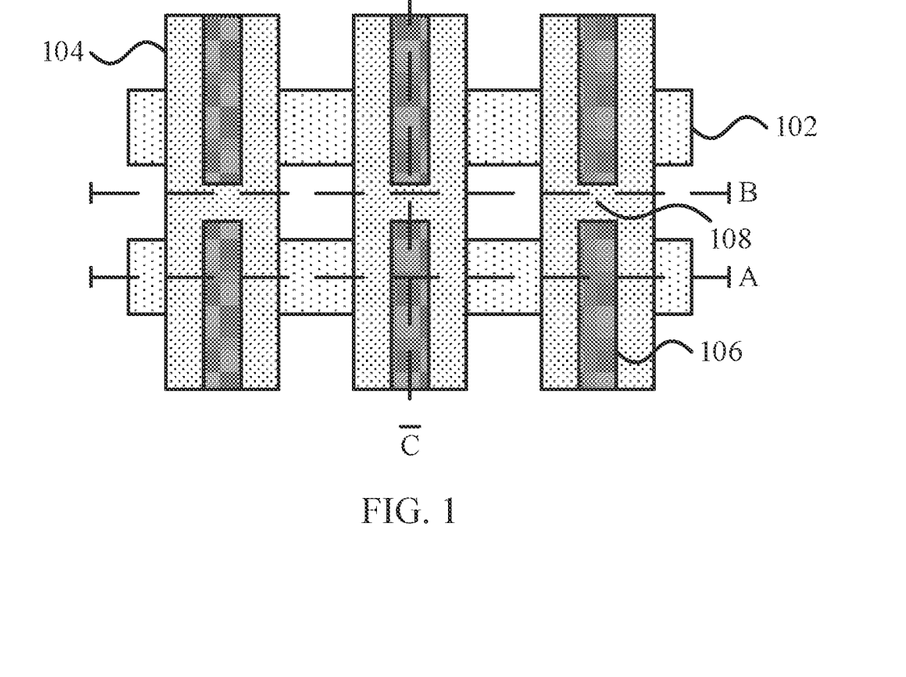
FIG. 1 is a top-down view of a semiconductor device that illustrates a three different cross-sections of a semiconductor device, showing an inter-device dielectric spacer, in accordance with an embodiment of the present invention.

Referring now to FIG. 1, a top-down view of a step in the fabrication of a set of transistor devices is shown. The top-down view shows three different cross-sections, A, B, and C, which are used herein to show different parts of the devices as they are being formed. Cross-section A shows a view that cuts through a stack of semiconductor nanosheets 102. Dummy gates 106 are formed over the nanosheets 102, with dielectric spacers 104 being formed on sidewalls of the dummy gates 106.

Two distinct stacks of nanosheets 102 are shown, and may be understood to be the basis for distinct sets of devices. In one illustrative example, a first set of devices may include n-type field effect transistors (nFETs), while a second set of devices may include p-type field effect transistors (pFETs). Each set of devices has a separate set of dummy gates 106, but may have a shared spacer structure 104. In particular, the shared spacer structure 104 may include an inter-device spacer 108 that separates adjacent device regions of differing polarity. Cross-section B cuts across the inter-device spacers 108, in a region between the different device types. Cross-section C cuts along a long axis of the dummy gates 106 of a pair of devices. The inter-device spacers 108 can provide gate cuts that are less than 10 nm, with good alignment.

Figure 2:
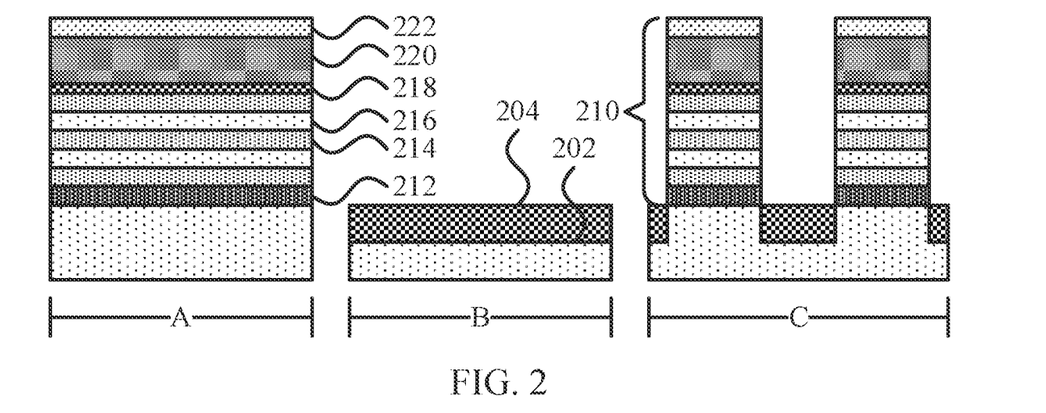
FIG. 2 is a set of cross-sectional views, A, B, and C, of a step in the formation of a semiconductor device with an inter-device dielectric spacer, showing the formation of stacks of layers in respective device regions, in accordance with an embodiment of the present invention.

Referring now to FIG. 2, a set of cross-sectional views, A, B, and C, are shown to illustrate a step in the fabrication of semiconductor devices. In this view, a stack of layers is shown, having been patterned into device stacks 210. The stacks 210 are formed on a semiconductor substrate 202, and are separated by shallow trench isolation (STI) regions 204.

The stacks 210 each include a first sacrificial semiconductor layer 212, upon which is formed a set of alternating semiconductor layers, including second sacrificial semiconductor layers 214 and channel layers 216. A dummy gate dielectric 218 is formed over the alternating semiconductor layers, and a dummy gate layer 220 is formed over the dummy gate dielectric 218. A mask 222 is used to establish the pattern of the device stacks 210. Although only two channel layers 216 are shown, it should be understood that any appropriate number of channel layers 216, with intervening first sacrificial layers 214, may be formed to create device stacks 210 of any appropriate height.

The semiconductor substrate 202 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the semiconductor substrate 202 may also be a semiconductor on insulator (SOI) substrate.

The STI regions 204 may be formed by etching a trench in the substrate 202, for example using a dry etching process such as reactive-ion etching (RIE) or plasma etching. The trenches may optionally be lined with a liner material, e.g., an oxide, and then filled with polysilicon or another like STI dielectric material. Alternatively, the trenches may be filled entirely with silicon dioxide. The STI dielectric may optionally be densified after deposition. A planarization process such as chemical-mechanical planarizing (CMP) may optionally be used to provide a planar top surface.

The stack of semiconductor layers may be formed by epitaxially growing each semiconductor layer from the top surface of the last, starting with growing the first sacrificial semiconductor layer 212 from the top surface of the semiconductor substrate 202. The terms "epitaxial growth and/or deposition" means the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

In one illustrative example, the first sacrificial semiconductor layer 212 may be formed from silicon germanium having a first germanium concentration, the second sacrificial layers 214 may be formed from silicon germanium having a second germanium concentration, and the channel layers may be formed from elemental silicon. The germanium concentrations of the first sacrificial layer 212 and the second sacrificial layers 214 may be selected to provide etch selectivity with respect to one another, and with respect to the channel layers 216. In one illustrative embodiment, the first germanium concentration may be about 60% and the second germanium concentration may be about 30%. As used herein, the term "selective" in reference to a material removal process denotes that the rate of material removal for a first material is greater than the rate of removal for at least another material of the structure to which the material removal process is being applied. Thus, the first sacrificial layer 212 may be etched away without substantially damaging the second sacrificial layers 214 and the channel layers 216, and the second sacrificial layers 214 can be etched away without substantially damaging the channel layers.

The dummy gate structure may include dummy gate dielectric 218, which may be formed from silicon dioxide, and a dummy gate layer 220, which may be formed from amorphous silicon. It should be understood that the dummy gate dielectric 218 and the dummy gate layer 220 are temporary structure, and so any materials with appropriate properties and etch selectivity may be used instead.

The mask 222 may be formed by any appropriate process, such as photolithography, whereby a mask material may be deposited and subsequently may be patterned by exposure to an appropriate wavelength of light, which causes the mask material to cure. An anisotropic etch may be used to etch down into the stack of layers, around the mask 222, to create the device stacks 210. Any appropriate directional etch, such as RIE, may be used. The etch may be a timed etch that stops on the STI regions 204, may be a series of selective etches, or may be any other appropriate etching process.

Figure 3:
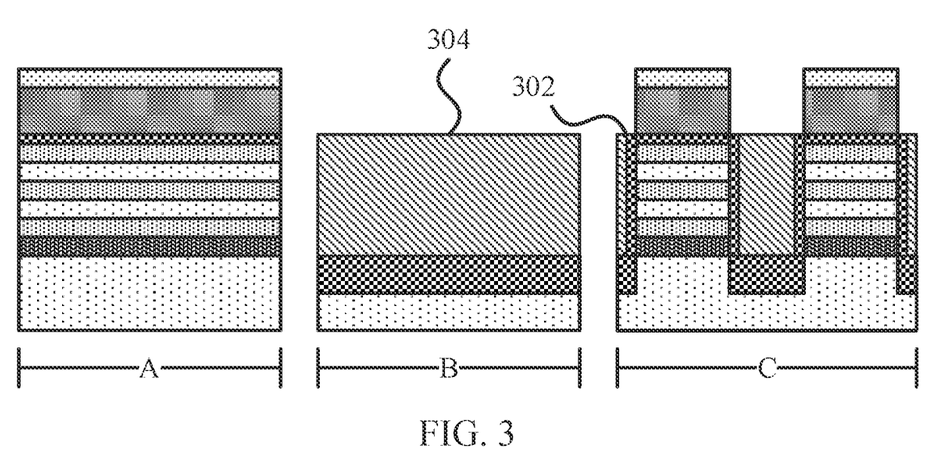
FIG. 3 is a set of cross-sectional views, A, B, and C, of a step in the formation of a semiconductor device with an inter-device dielectric spacer, showing the formation of a liner on sidewalls of the stacks, in accordance with an embodiment of the present invention.

Referring now to FIG. 3, a set of cross-sectional views, A, B, and C, are shown to illustrate a step in the fabrication of semiconductor devices. A thin liner material may be formed on sidewalls of the device stacks 210 using a conformal deposition process, such as chemical vapor deposition (CVD) or atomic layer deposition (ALD). In an illustrative example, the thin liner material may be formed from silicon dioxide. An organic planarizing layer (OPL) 304 may then be formed to roughly the same height as the top surface of the dummy gate dielectric 218, whether by depositing the OPL 304 to this thickness or by forming the planarizing material to a greater thickness and then etching it back. The exposed portions of the thin material may be etched, for example using a wet or dry isotropic chemical etch, to create thin liners 302.

CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use ALD, chemical precursors react with the surface of a material one at a time to deposit a thin film on the surface.

Figure 4:
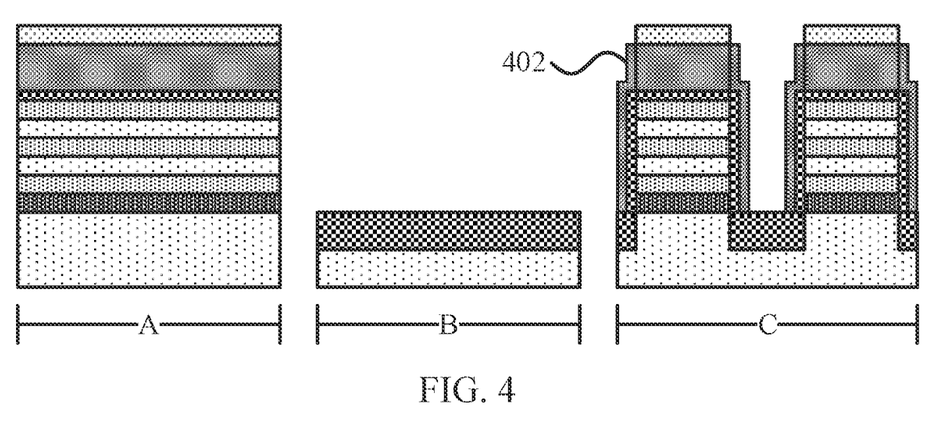
FIG. 4 is a set of cross-sectional views, A, B, and C, of a step in the formation of a semiconductor device with an inter-device dielectric spacer, showing the formation of a spacer on sidewalls of the stacks, in accordance with an embodiment of the present invention.

Referring now to FIG. 4, a set of cross-sectional views, A, B, and C, are shown to illustrate a step in the fabrication of semiconductor devices. The OPL 304 is removed, for example by an ashing process. Spacers 402 are then formed on sidewalls of the device stacks 204. The spacers 402 may be formed by, for example, conformally depositing a layer of spacer material, and then anisotropically etching the spacer material from horizontal surfaces. This etch may etch the top of the spacers 402 down to a height below the mask 222. In an illustrative example, the spacer material may be the same as the material that forms the dummy gates 220, e.g., amorphous silicon.

The spacers 402 make it possible to controllably shrink the space between adjacent devices, making it possible to define the horizontal thickness of a future gate cut structure. For example, the space between the structures in cross-sectional view C shows how this space may be narrowed by the deposition of the spacers 402. The thickness of the spacers 402 also defines the space available between device and gate cut dielectric material to form work function metal stacks.

Figure 5:
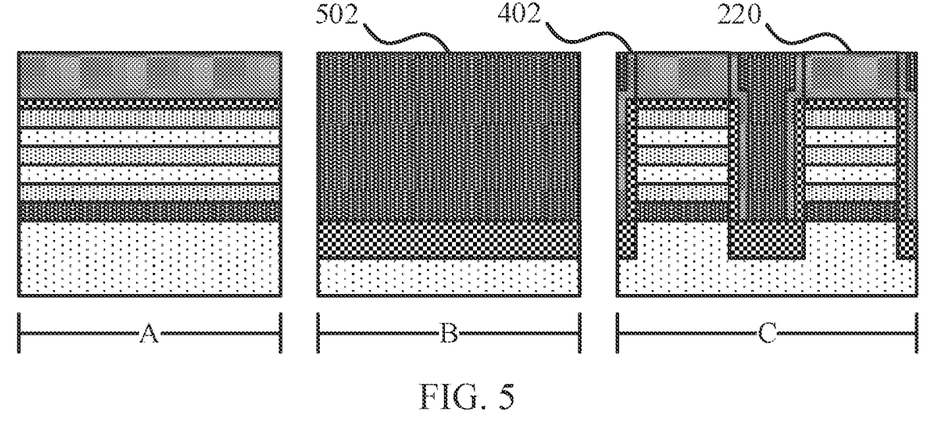
FIG. 5 is a set of cross-sectional views, A, B, and C, of a step in the formation of a semiconductor device with an inter-device dielectric spacer, showing the formation of sacrificial semiconductor material between and around the device regions, in accordance with an embodiment of the present invention.

Referring now to FIG. 5, a set of cross-sectional views, A, B, and C, are shown to illustrate a step in the fabrication of semiconductor devices. A third sacrificial layer 502 is formed, using any appropriate deposition mechanism, followed by polishing down to the level of the dummy gates 220, for example using a CMP process. It is specifically contemplated that the third sacrificial layer 502 may be formed from the same material as the first sacrificial layer 212 (e.g., silicon germanium with a 60% germanium concentration). The third sacrificial layer 502 fills a space between the device stacks 210.

CMP is performed using, e.g., a chemical or granular slurry and mechanical force to gradually remove upper layers of the device. The slurry may be formulated to be unable to dissolve, for example, the dummy gate material, resulting in the CMP process's inability to proceed any farther than that layer.

Figure 6:
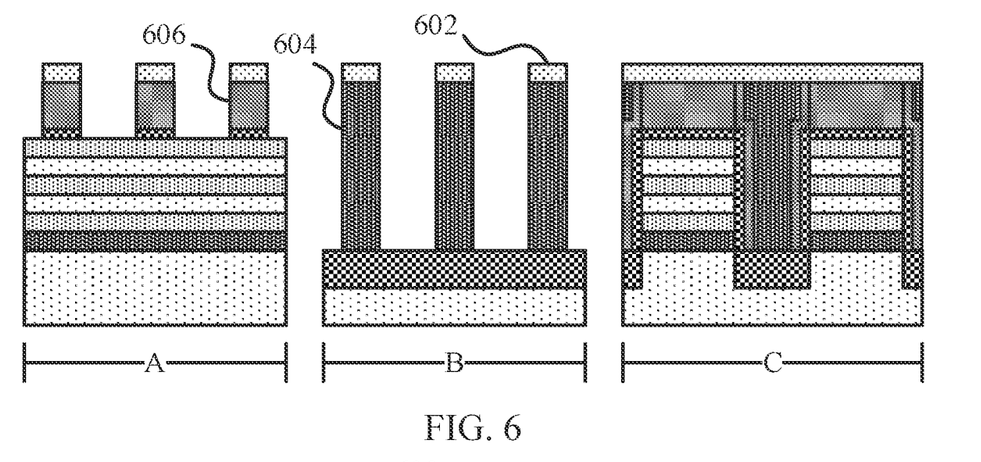
FIG. 6 is a set of cross-sectional views, A, B, and C, of a step in the formation of a semiconductor device with an inter-device dielectric spacer, showing the dummy gate structures over the device regions, in accordance with an embodiment of the present invention.

Referring now to FIG. 6, a set of cross-sectional views, A, B, and C, are shown to illustrate a step in the fabrication of semiconductor devices. A mask 602 is formed, defining a gate pattern. An anisotropic etch is performed, etching down into the dummy gate layer 220 with an anisotropic etch to form dummy gates 604, and also down into the third dielectric layer 502 to form sacrificial fins 606. The sacrificial fins 606 occupy a space between the device stacks 210. The etch may include a selective etch that does not substantially damage the stack of semiconductor layers.

Figure 7:
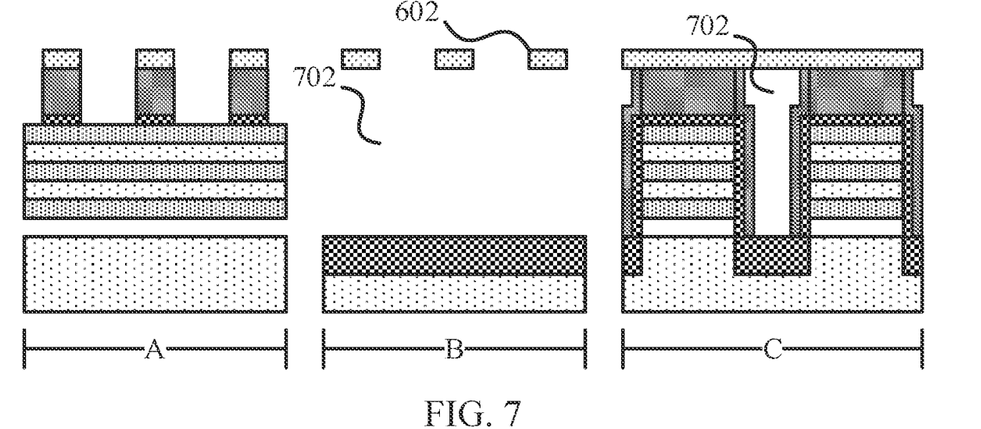
FIG. 7 is a set of cross-sectional views, A, B, and C, of a step in the formation of a semiconductor device with an inter-device dielectric spacer, showing removal of sacrificial from between and underneath the device regions, in accordance with an embodiment of the present invention.

Referring now to FIG. 7, a set of cross-sectional views, A, B, and C, are shown to illustrate a step in the fabrication of semiconductor devices. The first sacrificial layer 212 and the sacrificial fins 604 are selectively etched away using an isotropic etch, such as a wet or dry chemical etch. Cross-sections B and C show the mask 602 remaining, hanging over gap 702, between the device stacks 210.

Figure 8:
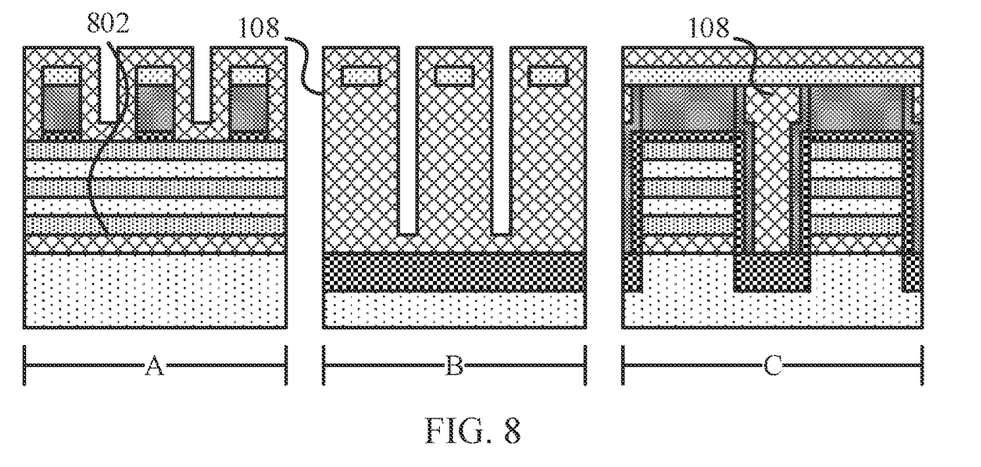
FIG. 8 is a set of cross-sectional views, A, B, and C, of a step in the formation of a semiconductor device with an inter-device dielectric spacer, showing the conformal deposition of inter-device spacer material, between and beneath the device regions, in accordance with an embodiment of the present invention.

Referring now to FIG. 8, a set of cross-sectional views, A, B, and C, are shown to illustrate a step in the fabrication of semiconductor devices. Inter-device spacers 108 are formed by conformally depositing spacer material using any appropriate process, such as CVD or ALD. The spacers 108 fill the space 702 between the device stacks 210. Spacer material also fills the space underneath the stack of semiconductor layers to form bottom spacers 802. Any appropriate dielectric material may be used, including silicon dioxide or a low-k dielectric material, such as SiBCN, SiOCN, or SiOC, or any combination thereof. Notably, the bottom spacers 802 fully isolate the device from the substrate, both in the channel area as well as in the area where the source/drain structures will be formed.

Figure 9:
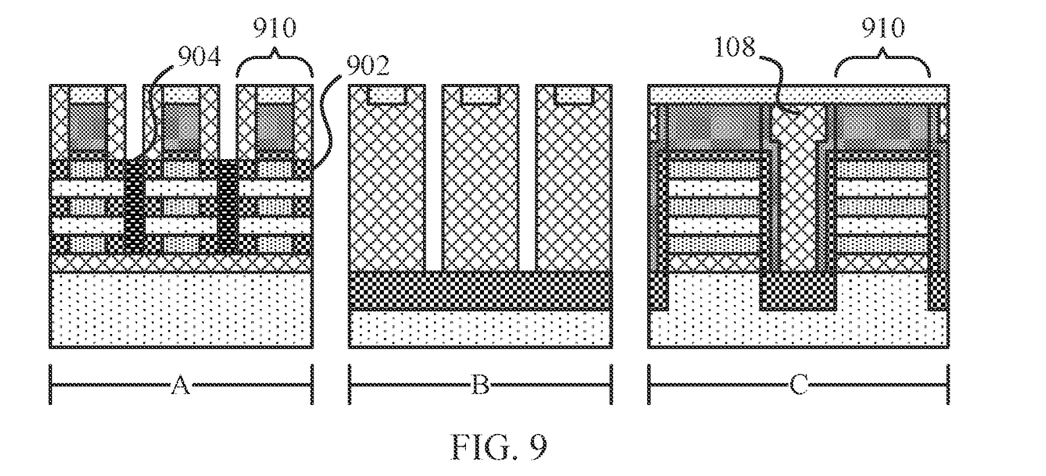
FIG. 9 is a set of cross-sectional views, A, B, and C, of a step in the formation of a semiconductor device with an inter-device dielectric spacer, showing an anisotropic etch of the inter-device spacer material, in accordance with an embodiment of the present invention.

Referring now to FIG. 9, a set of cross-sectional views, A, B, and C, are shown to illustrate a step in the fabrication of semiconductor devices. A selective anisotropic etch is used to remove spacer material from horizontal surfaces. Another selective anisotropic etch etches down into the stack of semiconductor layers, separating out device regions 910.

A condensation process may be performed, which may oxidize ends of the second sacrificial layers 214 to form silicon dioxide inner spacers 902. Source/drain regions 904 may then be epitaxially grown from exposed ends of the channel layers 216. The source/drain regions 904 may be formed from, e.g., doped silicon, with a dopant being selected to correspond to a polarity of the device being formed (e.g., n-type or p-type). The different device regions 910 may be differently doped, for example with some regions 910 being p-type doped and with other regions 910 being n-type doped. It is specifically contemplated that the two regions 910 shown on cross-section C may be of differing polarities. As noted above, the source/drain regions 904 will be separated from the underlying substrate by bottom spacers 802.

Figure 10:
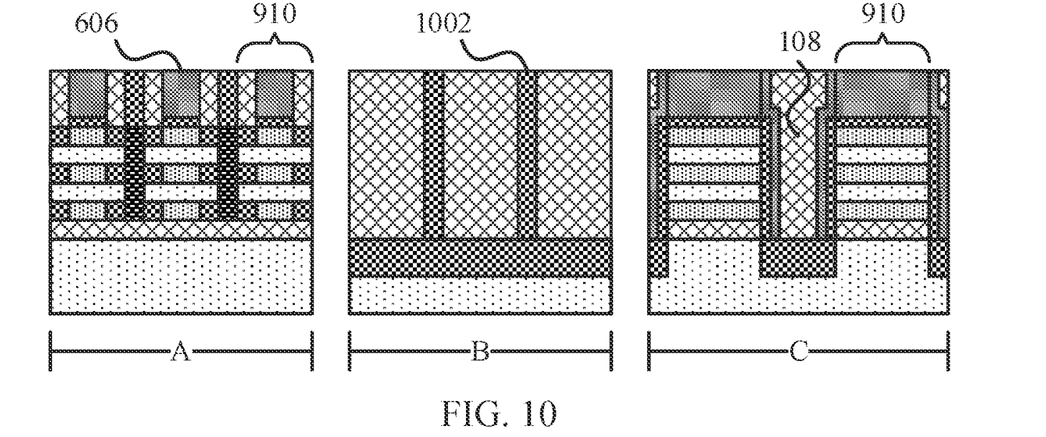
FIG. 10 is a set of cross-sectional views, A, B, and C, of a step in the formation of a semiconductor device with an inter-device dielectric spacer, showing the removal of a pattern mask, in accordance with an embodiment of the present invention.

Referring now to FIG. 10, a set of cross-sectional views, A, B, and C, are shown to illustrate a step in the fabrication of semiconductor devices. An interlayer dielectric material is deposited, filling gaps between the device regions 910 and between the spacers 108. A CMP process may then be used to polish away excess material, stopping on the dummy gates 606. The remaining interlayer dielectric material forms interlayer dielectric 1002, with the tops of the dummy gates 606 being exposed.

Figure 11:
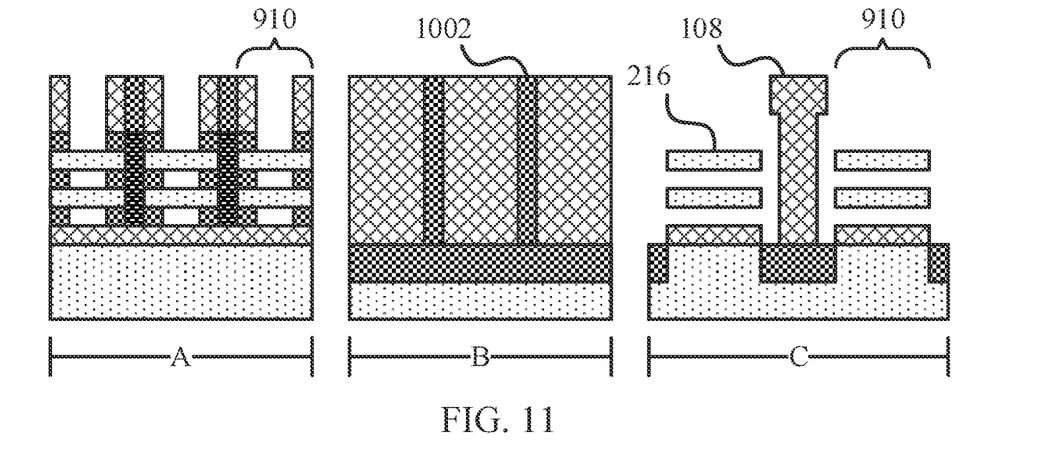
FIG. 11 is a set of cross-sectional views, A, B, and C, of a step in the formation of a semiconductor device with an inter-device dielectric spacer, showing the selective removal the dummy gate structures and sacrificial semiconductor material, in accordance with an embodiment of the present invention.

Referring now to FIG. 11, a set of cross-sectional views, A, B, and C, are shown to illustrate a step in the fabrication of semiconductor devices. Etches are performed that remove the dummy gates 608, the dummy gate dielectric 218, the remaining first sacrificial layers 214, and the lines 402. Any appropriate etches may be performed to remove these structures, leaving behind the channel layers 216 and the inter-device spacers 108. As shown in cross-sections A and C, the nanosheet channels 216 are suspended by the inner spacers 902 and the source/drain regions 904.

Figure 12:
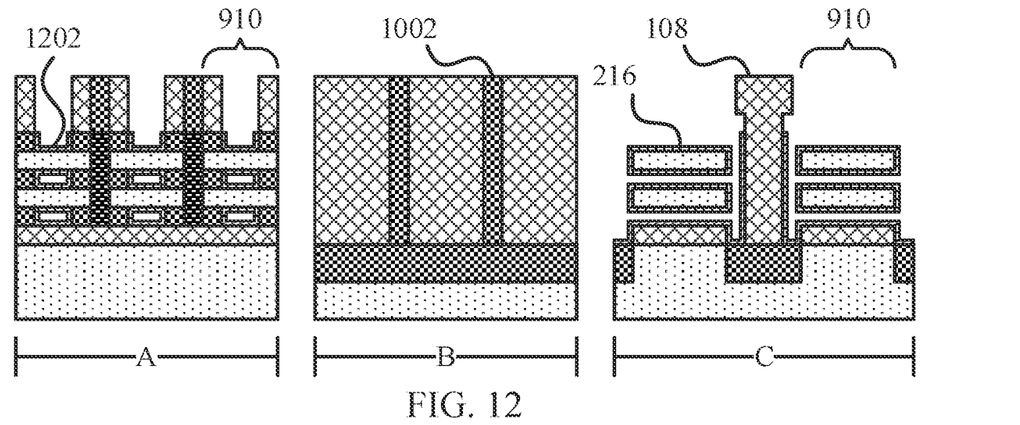
FIG. 12 is a set of cross-sectional views, A, B, and C, of a step in the formation of a semiconductor device with an inter-device dielectric spacer, showing the formation of a gate dielectric layer, in accordance with an embodiment of the present invention.

Referring now to FIG. 12, a set of cross-sectional views, A, B, and C, are shown to illustrate a step in the fabrication of semiconductor devices. A gate dielectric material is deposited using any appropriate conformal deposition process, such as CVD or ALD, and is then chamfered back to form gate dielectric layer 1202. The gate dielectric material may be formed from any appropriate material, such as a high-k dielectric. Examples of high-k dielectric materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as lanthanum and aluminum.

Figure 13:
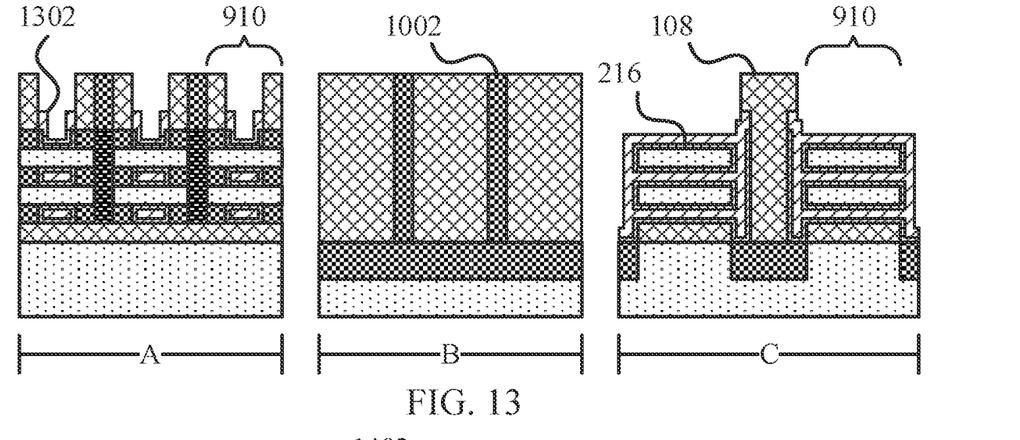
FIG. 13 is a set of cross-sectional views, A, B, and C, of a step in the formation of a semiconductor device with an inter-device dielectric spacer, showing the formation of a first work function metal layer across both device regions, in accordance with an embodiment of the present invention.

Referring now to FIG. 13, a set of cross-sectional views, A, B, and C, are shown to illustrate a step in the fabrication of semiconductor devices. A first layer of work function metal 1302 is formed, for example by conformally depositing the metal and then chamfering to an appropriate height. The first layer of work function metal 1302 may be formed from, e.g., an n-type or a p-type work function metal. In one embodiment, the first work function metal layer 1302 may be deposited by CVD or ALD.

As used herein, a "p-type work function metal layer" is a metal layer that effectuates a p-type threshold voltage shift. In one embodiment, the work function of the p-type work function metal layer ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero.

A p-type work function metal layer may be composed of titanium and its nitride/carbide. In one illustrative example, a p-type work function metal layer may include titanium nitride (TiN). The p-type work function metal layer may also be formed with TiAlN, Ru, Pt, Mo, Co, and alloys and combinations thereof.

As used herein, an "n-type work function metal layer" is a metal layer that effectuates an n-type threshold voltage shift. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In one embodiment, the work function of the n-type work function metal layer ranges from 4.1 eV to 4.3 eV. In one embodiment, the n-type work function metal layer may be formed with at least one of TiAl, TanN, TiN, HfN, HfSi, or combinations thereof.

Figure 14:
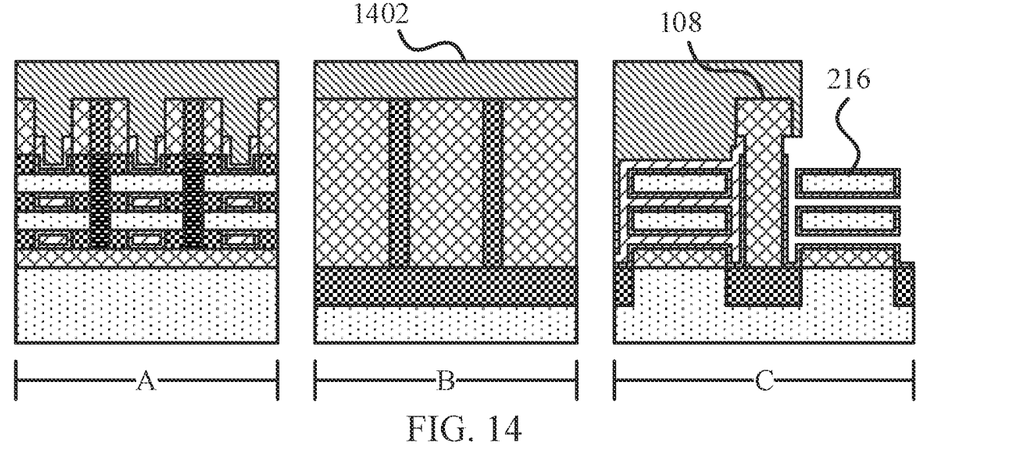
FIG. 14 is a set of cross-sectional views, A, B, and C, of a step in the formation of a semiconductor device with an inter-device dielectric spacer, showing the masking of one device region and the removal of the first work function metal layer in the second device region, in accordance with an embodiment of the present invention.

Referring now to FIG. 14, a set of cross-sectional views, A, B, and C, are shown to illustrate a step in the fabrication of semiconductor devices. An OPL 1402 is formed, covering one set of devices, leaving the other set of devices exposed. The exposed set of device may then be etched using a selective isotropic etch to remove exposed portions of the first work function metal layer 1302. The inter-device spacers 108 prevent the etch from affecting portions of the first work function metal layer 1302 that are covered by the OPL 1402. The OPL layer 1402 may be misaligned, as the isotropic etch will remove work function metal from underneath excess OPL width.

Figure 15:
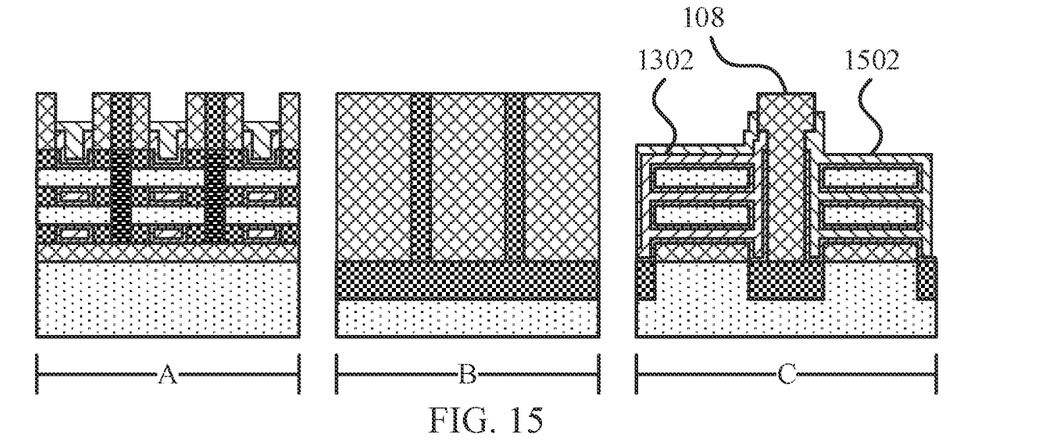
FIG. 15 is a set of cross-sectional views, A, B, and C, of a step in the formation of a semiconductor device with an inter-device dielectric spacer, showing the formation of a second work function metal layer across both device regions, in accordance with an embodiment of the present invention.

Referring now to FIG. 15, a set of cross-sectional views, A, B, and C, are shown to illustrate a step in the fabrication of semiconductor devices. A second work function metal layer 1502 is formed, for example by conformally depositing a work function metal and then chamfering back to an appropriate height. The second work function metal layer 1502 may be formed from a work function metal having a polarity opposite to that of the first work function metal layer 1302. For example, if the first work function metal layer 1302 is a p-type work function metal, then the second work function metal layer 1502 may be formed from an n-type work function metal.

In one set of devices, both the first work function metal layer 1302 and the second work function metal layer 1502 may be present. Because the first work function metal layer 1302 interfaces with the channels 216, it affects the threshold voltage of the channels 216 in that region, while the second work function metal layer 1502 does not. In another set of devices, only the second work function metal layer 1502 is present, and it affects the threshold voltage of the channels 216 in that region. Because the inter-device spacers 108 separate the two sets of devices from one another, there is no damage to the first work function metal layer 1302 from unintended over-etch.

Figure 16:
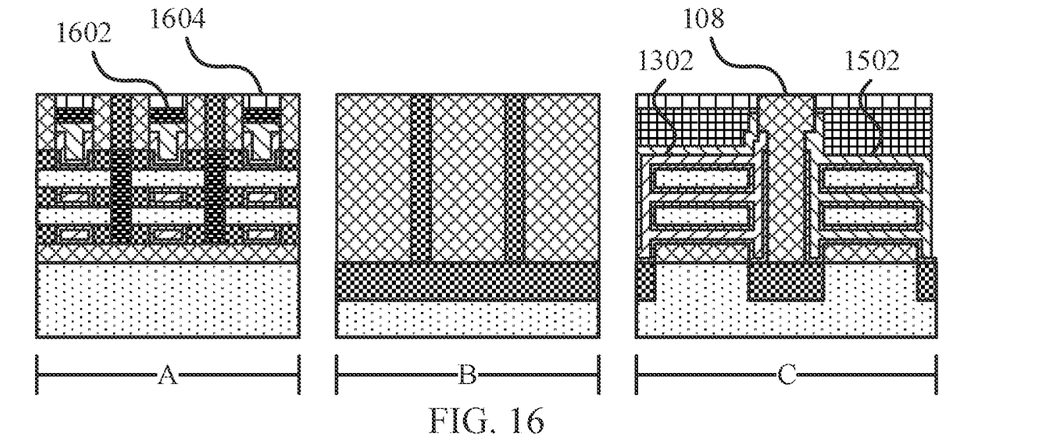
FIG. 16 is a set of cross-sectional views, A, B, and C, of a step in the formation of a semiconductor device with an inter-device dielectric spacer, showing the formation of gate contacts, in accordance with an embodiment of the present invention.

Referring now to FIG. 16, a set of cross-sectional views, A, B, and C, are shown to illustrate a step in the fabrication of semiconductor devices. A gate 1602 may be formed by any appropriate process, contacting the work function metal layers 1302 and 1502 in the respective device regions. The gate 1602 may be formed from any appropriate conductive material. The gate 1602 may be formed from any appropriate conductive metal such as, e.g., tungsten, nickel, titanium, molybdenum, tantalum, copper, platinum, silver, gold, ruthenium, iridium, rhenium, rhodium, cobalt, and alloys thereof. The gate 1602 may alternatively be formed from a doped semiconductor material such as, e.g., doped polysilicon. A self-aligned contact cap 1604 may be formed over the gate 1602, and may be polished flat using a CMP process.

Figure 17:
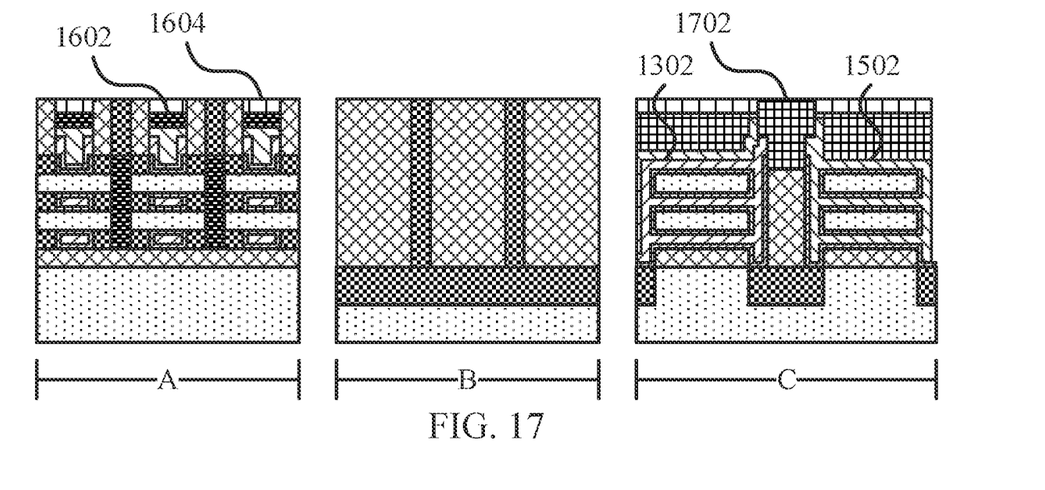
FIG. 17 is a set of cross-sectional views, A, B, and C, of a step in the formation of a semiconductor device with an inter-device dielectric spacer, showing the formation of a shared gate contact, in accordance with an embodiment of the present invention.

Referring now to FIG. 17, a set of cross-sectional views, A, B, and C, are shown to illustrate a step in the fabrication of semiconductor devices. A shared gate 1702 may optionally be formed, electrically connecting the gates 1602 of the different device layers, for example by contacting them directly or by contacting portions of the work function metals. This may be done, for example to form a complementary device, such as a complementary metal-oxide-semiconductor (CMOS) device. For example, the shared gate 1702 may be formed by etching back the inter-device spacer 108, depositing the conductive material, and polishing back to the level of the self-aligned contact cap 1604.

Figure 18:
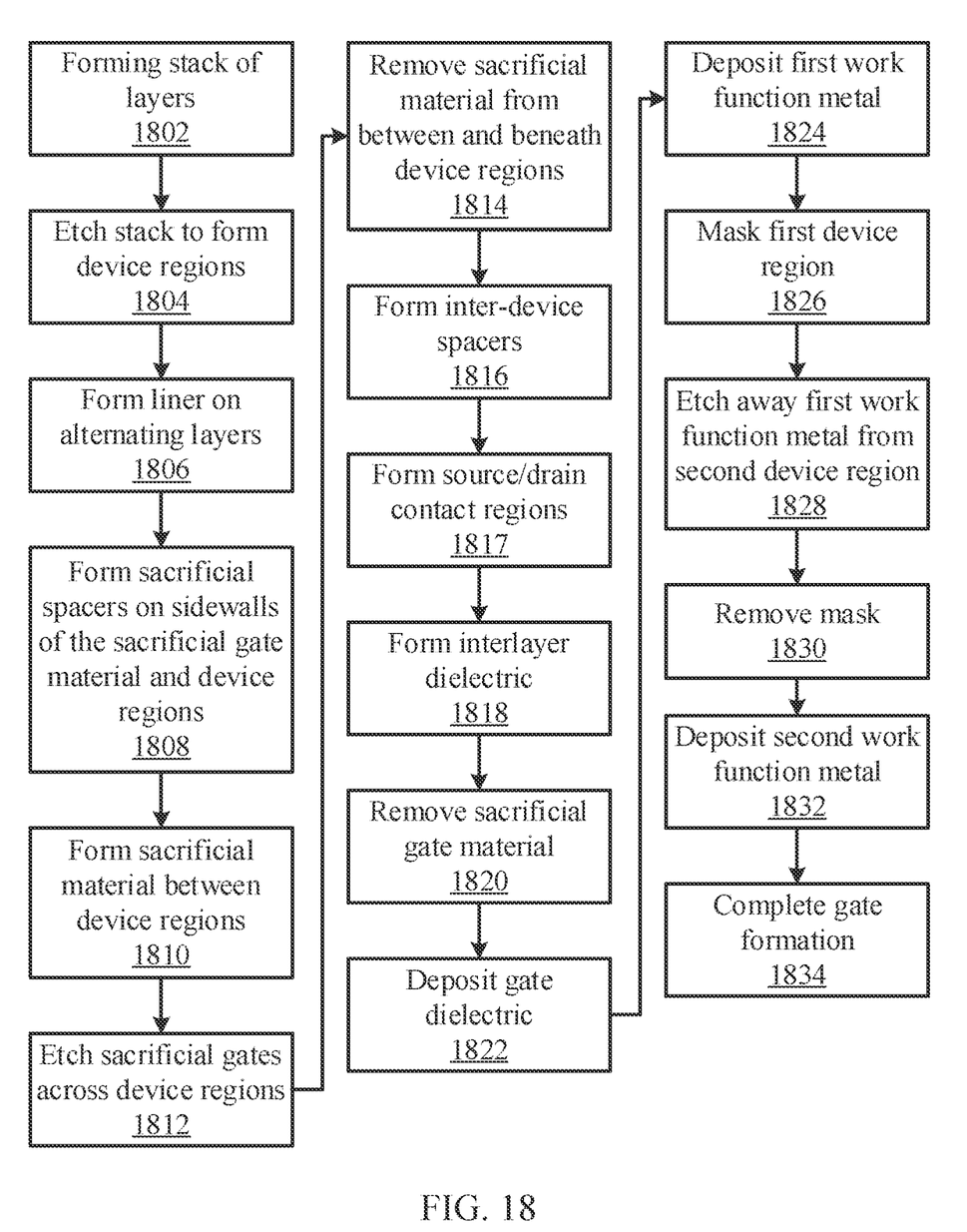
FIG. 18 is a block/flow diagram of a method of forming a semiconductor device with an inter-device dielectric structure, in accordance with an embodiment of the present invention.

Referring now to FIG. 18, a method of forming semiconductor devices with differing work function metals is shown. Block 1802 forms a stack of layers. The stack may include a first sacrificial layer 212, a set of alternating second sacrificial layers 214 and channel layers 216, a dummy gate dielectric 218, and a dummy gate layer 220. Block 1804 patterns the stack of layers, using a mask 222 to define device regions and an anisotropic etch to etch down into the stack of layers.

Block 1806 forms a liner 302 on sidewalls of the alternating layers in each device region, for example by conformally depositing a layer of oxide and then chamfering to an appropriate height. Block 1808 forms spacers 402 on sidewalls of the stack in each device region. The spacers 402 may be formed from the same material as the dummy gate layer 220, such as amorphous silicon, and may be formed by conformally depositing the material, then anisotropically etching it from horizontal surfaces.

Block 1810 forms sacrificial material 502 between the device regions, for example using any appropriate deposition process with the same material as the first sacrificial layer 212, followed by a CMP process down to the level of the dummy gate layer 220. Block 1812 then etches fins across the device regions, forming a mask 602 and then anisotropically etching down. This forms sacrificial fins 604 and sacrificial dummy gates 606.

Block 1814 removes the sacrificial material 502 and the first sacrificial layers 212, for example using any appropriately selective isotropic etch. This opens spaces 702 between the device regions, with the mask 602 remaining over the gaps 702. Block 1816 forms inter-device spacers 108, for example using a conformal deposition process that fills the gaps 702 between the device regions and that furthermore fills in the space underneath the stacks of alternating layers. The inter-device spacers 108 may include gate spacers, bottom dielectric isolation, and self-aligned gate cut structures. Block 1817 forms source/drain contact regions 904, self-aligned to the sacrificial gates 606. Block 1818 then forms an interlayer dielectric 1002 to fill remaining gaps around the device regions.

Block 1820 etches away the second sacrificial semiconductor layers 214, for example using an appropriately selective isotropic etch process that leaves the channel layers 216 in place. Block 1820 also removes the dummy gate structures 606. Block 1822 then deposits a gate dielectric layer 1202, for example using a conformal deposition process with a high-k dielectric material.

Block 1824 deposits a first work function metal 1302 in two device regions, for example using a conformal deposition with a work function metal of a first polarity. Block 1826 then masks a first of the two device regions, for example using an OPL 1402. This may be performed by depositing a layer of organic planarizing material uniformly over both device regions and then selectively removing the material from the second device region. Block 1828 etches away the first work function metal material from the second device region. Block 1320 then removes the OPL 1402, uncovering the first device region. Block 1322 deposits second work function metal 1502 over both device regions.

Block 1834 then forms gates 1602 over the device regions. In some cases, the gates may 1602 may be separate, while in other cases the gates 1602 may be electrically connected with a shared gate structure 1702. In the latter case, block 1834 may include a step of etching back in the inter-device spacers 108 and depositing a conductive material in the gap.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, may be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

Having described preferred embodiments of nanosheet transistors with complementary work function metals (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A semiconductor device, comprising:
    a first device region that includes:
        a first device channel;
        a first-polarity work function metal layer on the first device channel; and
        a second-polarity work function metal layer on the first device channel:
    a second device region that includes:
        a second device channel;
        a second-polarity work function metal layer on the second device channel; and
    an inter-device dielectric spacer between the first device region and the second device region.

2. The semiconductor device of claim 1, wherein the first device region and the second device region further comprise respective gate dielectric layers, each formed on the respective device channel and on sidewalls of the inter-device dielectric spacer.

3. The semiconductor device of claim 1, wherein the first device region further includes a first gate structure over the first-polarity work function metal layer and the second-polarity work function metal layer, and wherein the second device region further includes a second gate structure over the second-polarity work function metal layer.

4. The semiconductor device of claim 3, wherein the inter-device dielectric spacer is a self-aligned gate cut pillar that contacts the first gate structure and the second gate structure.

5. The semiconductor device of claim 3, wherein the inter-device dielectric spacer has a top surface with a height that is above a top surface of the first gate structure and the second gate structure.

6. The semiconductor device of claim 5, further comprising a shared gate contact over the inter-device dielectric spacer that makes electrical contact with the first gate structure and the second gate structure.

7. The semiconductor device of claim 1 wherein the first device region further includes first source/drain structures and a first bottom spacer, and wherein the second device region further includes second device structures and a second bottom spacer.

8. The semiconductor device of claim 7, wherein the first bottom spacer separates the first work-function metal layer on the first device channel, the second work-function metal layer on the first device channel, and the first source/drain structures from an underlying substrate, and wherein the second bottom spacer separates the second work function metal layer on the second device channel and the second source/drain structures from the underlying substrate.

9. A semiconductor device, comprising:
- a plurality of device regions, including a first device region and a second device region, each device region including:
  - a device channel;
  - a gate stack;
  - source/drain structures; and
  - a bottom spacer, between an underlying substrate and the first source/drain structures;
- an inter-device dielectric spacer between the first device region and the second device region, having a top surface with a height that is below top surfaces of the respective gate structures of the first device region and the second device region; and
- a shared gate contact over the inter-device dielectric spacer that makes electrical contact with the respective structures of the first device region and the send device region.

10. The semiconductor device of claim 9, wherein the inter-device dielectric spacer is a self-aligned gate cut pillar that contacts the respective gate structures of the first device region and the second device region.

11. The semiconductor device of claim 10, wherein the inter-device dielectric spacer extends vertically from the respective bottom spacers of the first device region and the second device region, to a height above the device channels of the first device region and the second device region.

* * * * *